March 7, 1967 H. LEYSIEFFER ETAL 3,308,379

FREQUENCY STABILIZED FREQUENCY CONVERTING RADIO REPEATER WITH LOCAL FREQUENCY MODULATION

Filed May 23, 1963

United States Patent Office 3,308,379
Patented Mar. 7, 1967

3,308,379

FREQUENCY STABILIZED FREQUENCY CONVERTING RADIO REPEATER WITH LOCAL FREQUENCY MODULATION

Hans Leysieffer, Munich-Solln, and Egmont Gabler, Munich, Germany, assignors to Siemens & Halske Aktiengesellschaft Berlin and Munich, a corporation of Germany Filed May 23, 1963, Ser. No. 282,779
Claims priority, application Germany, May 25, 1962, S 79,617
2 Claims. (Cl. 325—3)

The present invention relates to a radio link having a transmitter utilizing frequency conversion in which the radio frequencies are integral multiples of a fundamental frequency which is located within a region of substantially lower frequencies.

Radio links operate as a rule with receivers and transmitters utilizing frequency conversion, and therefore require oscillators of high constancy of frequency in order to obtain the heterodyne frequencies. The known systems of this type operate in the manner that either a plurality of individual quartz oscillators is provided or that all carrier frequencies required in the entire transmission system are derived separately from a single generator which is stabilized in frequency by means of a piezoelectric resonator. While the first mentioned system produces upon each change in frequency also a change in the corresponding piezoelectric resonator with the difficulties inherent therein, the last mentioned system is extremely expensive as can already be recognized from the fact that in one known embodiment of this system, two rack cabinets are required solely for the supplying of this high frequency carrier.

The object of the present invention is to avoid these difficulties in a radio link of the initially described type.

Starting from a radio link having a frequency conversion transmitter in which the radio frequencies are integral multiples of a fundamental frequency $f_0$ located in a region of substantially lower frequencies, this object is achieved in accordance with the invention by the provision of an oscillator which oscillates freely at the conversion frequency required for the conversion repeater, and further, by the provision of a frequency-stabilized oscillating fundamental oscillator, preferably stabilized in frequency by means of a piezoelectric resonator to the fundamental frequency $f_0$ is provided, a preferably negligibly small portion of the output energy of the freely oscillating oscillator, as well as a portion of the output energy of the frequency stabilized oscillator, which portion has been multiplied in frequency to the required radio frequency, being fed to a mixing stage, to the output of which are connected an intermediate frequency amplifier tuned to the intermediate frequency of the transmitter and a frequency discriminator, which actuate a frequency-adjusting device of the freely oscillating oscillator in order to bring it back to its proper frequency value.

If at an intermediate link, the transmitting frequency is displaced by a predetermined frequency value from the receiving frequency, and if this displacement or shift frequency is also an integral multiple of the fundamental frequency $f_0$, it is advantageous for a further portion of its output energy to be taken from the fundamental oscillator and multiplied in frequency to the displacement frequency, and for the high frequency energy thus obtained to be converted with displacement frequency in a further mixing stage with a portion of the output energy of the freely oscillating oscillator for the converter frequency of the receiving frequency converter.

Another advantageous alternative is to provide a further freely oscillating oscillator for obtaining the conversion frequency for the receiving converter, the frequency of which is readjusted in the same manner as for other freely oscillating oscillator from the fundamental oscillator which is common to both freely oscillating oscillators. This makes it possible to provide a further advantageous arrangement of the system by providing preferably the freely oscillating oscillator serving for obtaining the receiving displacement frequency, with frequency modulation means for insertion of additional modulation signals and inserting in the frequency adjusting devices of both freely oscillating oscillators, low-pass filters, the upper cutoff frequency of which lies below the lowest modulation frequency. It is advantageous in this connection for the frequency adjusting devices of both freely oscillating oscillators to be developed as motor actuated frequency adjustment devices, and to provide, in the modulation line of one freely oscillating oscillator, a high-pass filter or band-pass filter, the lower cutoff frequency of which is higher than the highest frequency resulting from the control time constant of the motor actuated frequency adjustment.

It has furthermore proven advantageous if the frequency multiplication of the output energy of the fundamental oscillator of the frequency $f_0$ is effected by means of a varactor diode circuit to the required output frequency value in a stage in the output of which frequency-selective networks are provided for the separate removal of the required frequencies. As a further development of the invention, this development can be effected in the manner that to the fundamental oscillator of the frequency $f_0$, there are connected separate frequency multipliers for the individual frequencies which in each case are provided from a varactor diode circuit with a network for the screening out in each case of one frequency.

The invention will now be described in further detail with reference to the accompanying drawing.

Figures 1, 2:
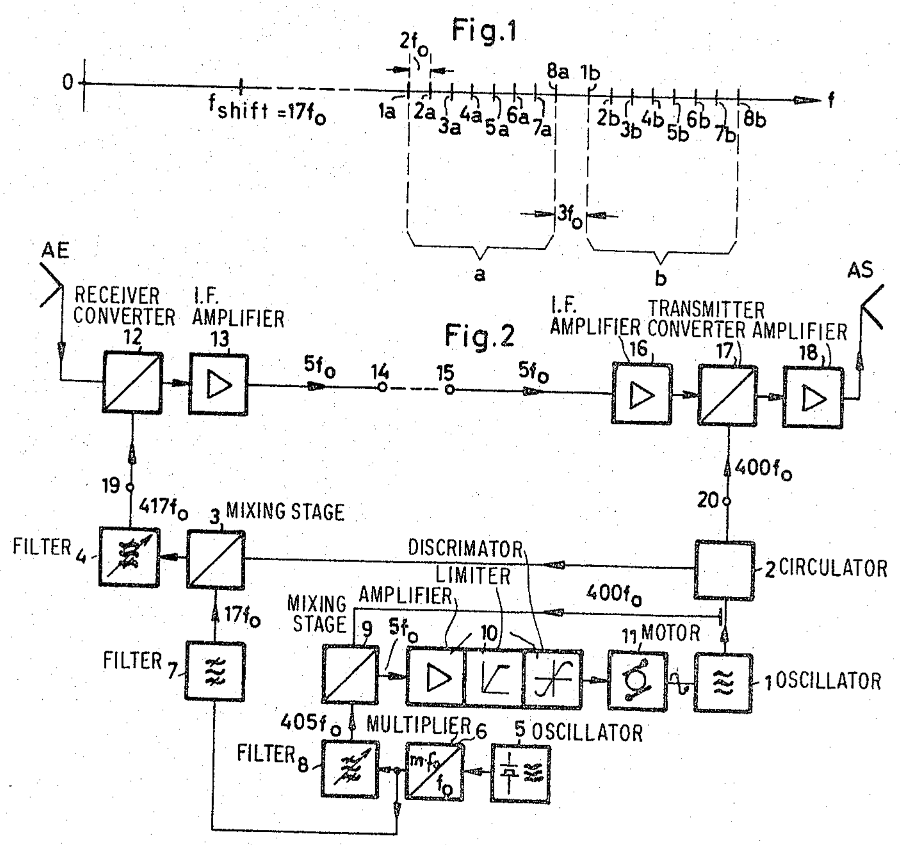
FIG. 1 shows for explanatory purposes a frequency scheme, for example, for the 6 gigacycle range in accordance with the CCI-standard.
FIG. 2 represents an example of a circuit according to the invention, which makes it possible to operate in accordance with the scheme shown in FIG. 1.

Referring now to FIG. 1, reference *a* indicates the lower band and reference *b* the upper band of the indicated gigacycle range. Each band contains 8 channels, which are designated 1*a*, 2*a*, 3*a*, 4*a*, 5*a*, 6*a*, 7*a* and 8*a* and 1*b* to 8*b* respectively. The spacing between two adjacent channels of the band is $2f_0$. If the frequency spacing of the adjacent channels of the lower band and of the upper band is $3f_0$, then the spacing between identically numbered channels of the upper band and of the lower band is $17 \cdot f_0$. This displacement frequency $17 \cdot f_0$ is also shown schematically in FIG. 1. Therefore, the operation is as a rule, so that for instance in the first section of the link, a channel of the lower band is provided as transmitting frequency and the same numbered channel of the upper band as receiving frequency, while in the successive portion of the link, this is reversed. If the frequency spacing of the channels 8*a* and 1*b* is other than $3f_0$, then the displacement frequency $n \cdot f_0$ must be selected correspondingly different.

The frequency value of $f_0$ is determined, for example, for the 6 gigacycle range at about 14.8 megacycles.

The example of a circuit in accordance with the invention, shown in FIG. 2, which makes it possible to operate in accordance with the frequency scheme shown in FIG. 1, relates to an intermediate point in a radio link having the receiving antenna AE and the transmitter antenna AS. The electromagnetic waves received, for instance from the channel 7*b* of the frequency scheme of FIG. 1, are fed via customary filters and other circuit elements to a receiving converter 12, to the output of which is connected an intermediate frequency amplifier 13. The intermediate frequency oscillations are available at the output 14 and can be fed directly to the input 15 of a transmission-side intermediate frequency amplifier 16 which in its turn feeds the transmission converter 17 for conversion of the intermediate frequency voltage, for instance into the channel 7*a*. The output energy of this frequency converter is appropriately fed via a wideband amplifier, such as a traveling wave tube amplifier 18, with the interposition of the customary travel time compensating members, directional lines, filters, etc., to the transmitting antenna AS. The heterodyne frequency is obtained by the receiving converter 12 via the feed line 19 and by the transmitting converter 17 via the feed line 20. That part of the circuit at the intermediate point of the radio link which adjoins these two connections represents the carrier supply of the intermediate point.

The carrier supply of the radio link comprises a freely oscillating high frequency generator 1 which oscillates on the frequency of for instance $400 \cdot f_0$ required for the transmission converter 17 and is provided with a frequency adjustment which will be presently explained in further detail. The output line of this freely oscillating generator 1 is preferably divided up via a circulator 2 or via a 3-db-directional coupler, namely, on the one hand to the converter 17 and on the other hand to a mixing stage 3. The frequency adjustment is a motor adjustment in the embodiment given by way of example. For this purpose, a small portion of the output power is taken from the freely oscillating oscillator 1, for instance capacitively, and fed to a mixing stage 9. As further input voltage, this mixing stage receives, after prior multiplication, a portion of the output energy of an oscillator 5, which oscillates at the frequency $f_0$ of the frequency scheme of FIG. 1, and is preferably stabilized in frequency by means of a piezo resonator. The multiplication occurs in a multiplier circuit 6 which contains a reactance diode, in the output of which there is contained a filter 8 which is selective, for instance, for the frequency $405f_0$, and is permeable only in this region. In this manner, there is formed in the output of the mixing stage 9, inter alia, the difference frequency of $5f_0$ which, after corresponding amplification and amplitude limiting, is fed to a frequency discriminator in the circuit group 10, the center frequency of which (output voltage 0) corresponds to the prescribed value $5f_0$. By this discriminator, the frequency adjustment motor 11 is actuated, possibly with intermediate amplification, which motor mechanically effects the frequency adjustment of the freely oscillating oscillator 1.

Furthermore, in the case of the embodiment described by way of example, a part of the output energy from the output of the amplifier 6 is also fed to another frequency-selective network 7 which filters from the frequency spectrum of the multiplier 6, the high frequency energy with displacement frequency, for instance $f_{shift}=17f$, and feeds it as second converter voltage to the mixing stage 3. In the output of said stage, the sum frequency, that is, $417f_0$ in the case of the example, is removed by means of a corresponding filter circuit 4 and fed to the receiving converter connection 19.

In the embodiment selected by way of example, the frequency multiplication is obtained in the stages 6, 7, 8, by effecting in a varactor diode in stage 6, with the frequency $f_0$, a strong distortion of the preferably sinusoidal output voltage of the fundamental oscillator 5. From the strongly distorted output oscillation of stage 6, the desired frequencies $17f_0$ and $405f_0$ are then filtered out by means of the filters 7 and 8. In particular, the filter 8 is tuneable, whereby a change of the frequencies can be obtained at the connections 17 and 19 in the following manner: The filter 8 is tuned, for example, to the 407th harmonic of $f_0$, rather than the 405th. It is then sufficient to retune the freely oscillating oscillator 1 to the point at which the motor adjustment 11 becomes active. The oscillator 1 then locks to the prescribed frequency and is held at the same by the frequency adjustment 11. It is in this connection advisable that the adjustment range of the frequency adjustment to be less than half the frequency spacing between adjacent channels in the frequency scheme of FIG. 1. When the oscillator 1, upon the frequency adjustment, has locked to the proper frequency, it is appropriately tuned further so that the frequency adjustment has approximately the same control range toward higher and lower frequencies.

The frequency $5f_0$ was selected in the described embodiment for the reason that it also corresponds to the intermediate frequency of the radio link system, which is present in the amplifiers 13 and 16. The frequency ratio between the piezo-resonator frequency and the intermediate frequency must, however, not be an integer. The system therefore has the advantage that the intermediate frequency in the given frequency scheme, for example corresponding to FIG. 1, can be freely selected within certain limits. On the other hand, the intermediate frequency in the radio link and therefore in the amplifiers 13, 16 must be in all cases equal to the intermediate frequency in the frequency adjustment circuit and therefore in the amplifier, limiter and discriminator 10.

If the carrier supply in accordance with FIG. 2 is caused to act in an end position (reception or transmission) of the radio link, the circuit groups 3, 4 and 7 and possible also 2 can be eliminated. There then remains only the connection 20 as connection for the end rack on the part of the carrier supply.

Figure 3:
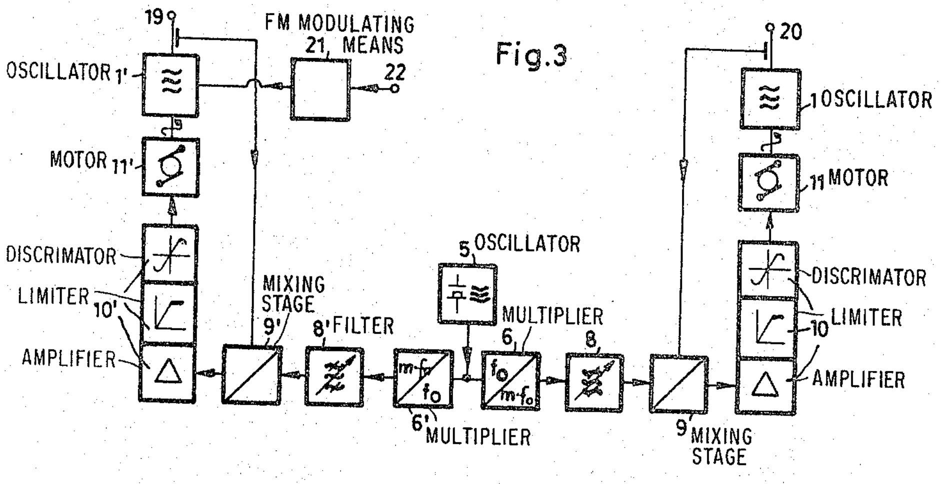
FIG. 3 indicates a further embodiment of the carrier supply.

A further development of the carrier supply shown in FIG. 2 is shown in FIG. 3. Separate generators, the frequency of which is controlled by the method explained in FIG. 2, are used here for the transmission converter and the receiving converter. Corresponding devices are identically referenced, distinguished only by a prime mark. The control fundamental oscillation $f_0$ is taken from a common quartz generator 5 so that in this case also, except for the residual error of the adjustment circuit there is assured a fixed difference frequency of, for instance, $f_{shift}=17 \cdot f_0$ between the two carrier oscillations. The expenditure is in this case somewhat greater, since two generators 1, 1' with adjustment device are used. However, the advantage is obtained that one of the two generators can be modulated in frequency, for instance, by means of a reactance diode 21, so that, in contradistinction to known systems, speech signals can also be fed into the radio link at intermediate points, via the connection 22. The region of the base band utilized for the additional modulation signal may in this case not be occupied at the starting point of the radio link.

The power of the conversion oscillation can advantageously be selected substantially lower for the receiving conversion than for the transmitting conversion. It is in this case particularly advisable to modulate in frequency the oscillator for the receiving conversion with the lower power. However, provision should be made that the frequency adjustment circuit of the modulated oscillator does not respond to the modulation, for which purpose it is advisable to insert into the control circuit a low-pass filter, the upper cutoff frequency of which is below the lowest modulation frequency. In the embodiment described by way of example, the adjustment motor 11' serves as such a low-pass filter.

Changes may be made within the scope and spirit of the appended claims which define what is believed to be new and desired to have protected by Letters Patent.

We claim:

1. A radio link for a plurality of radio frequency channels in which the respective channel frequencies are integral multiples of a substantially lower fundamental frequency, comprising a receiver and a transmitter each including a frequency converter for effecting a frequency conversion to and from an intermediate frequency respectively, means connecting an output of said converter of said receiver to an input of said converter of said transmitter, a controllable oscillator connected to said converter of said transmitter which oscillates freely at a conversion frequency necessary for derivation of the transmitting frequency from the intermediate frequency, a stabilized oscillator generating said fundamental frequency, means connected to receive an output from the frequency-stabilized oscillator for multiplying the same in frequency and having a pair of separate outputs, a mixing stage connected to an output of said controllable oscillator and one output of said multiplying means, with said multiplied frequency of said one output differing from that of the controllable oscillator by the intermediate frequency, an intermediate frequency amplifier connected to an output of said mixing stage and tuned to the intermediate frequency, a frequency discriminator connected to said intermediate frequency amplifier, means for adjusting the frequency of said controllable oscillator to its proper frequency value, means connecting the output of said discriminator to said adjusting means, a second mixer having one input connected to the other output of said multiplying means and another input connected to an output of said controllable oscillator, an output of said second mixer connected to said converter of said receiver.

2. A radio link for a plurality of radio frequency channels, in which the respective channel frequencies are integral multiples of a substantially lower fundamental frequency, comprising a receiver and a transmitter each including a frequency converter for effecting a frequency conversion to and from an intermediate frequency respectively, means connecting an output of said converter of said receiver to an input of said converter of said transmitter, a pair of controllable oscillators each connected to a respective one of said converters which oscillate freely at a conversion frequency necessary for derivation of the intermediate frequency and the transmitting frequency respectively, a stabilized oscillator generating said fundamental frequency, a pair of frequency multipliers connected to an output of said stabilized oscillator, a pair of mixing stages each connected to an output of a respective one of said frequency multipliers and to an output of a respective one of said controllable oscillators, with the output of each of said multipliers differing in frequency from that of a respective one of said controllable oscillators by the intermediate frequency, a pair of intermediate frequency amplifiers each connected to an output of a respective one of said mixing stages and tuned to the intermediate frequency, a pair of frequency discriminators each connected to a respective one of said intermediate frequency amplifiers, a pair of frequency adjusting devices each connected between a respective one of said discriminators and a respective one of said controllable oscillators, and frequency modulation means connected to one of said controllable oscillators connected with the receiver converter for the insertion of additional modulation signals therein.

References Cited by the Examiner

UNITED STATES PATENTS

| | | | |
|---|---|---|---|
| 2,460,781 | 2/1949 | Cantelo | 325—20 |
| 2,474,354 | 6/1949 | Guanella | 325—17 |
| 2,529,579 | 11/1950 | Thompson | 331—30 |
| 2,790,072 | 4/1957 | Hugenholtz et al. | 325—17 |
| 3,108,223 | 10/1963 | Hunter | 325—153 |

FOREIGN PATENTS

| | | | |
|---|---|---|---|
| 666,178 | 2/1952 | Great Britain. | |

DAVID G. REDINBAUGH, *Primary Examiner.*

B. V. SAFOUREK, *Assistant Examiner.*